(12) United States Patent  (10) Patent No.: US 8,773,005 B2
Mizusawa et al.  (45) Date of Patent: Jul. 8, 2014

(54) QUARTZ-CRYSTAL DEVICES EXHIBITING REDUCED ELECTRICAL IMPEDANCE

(75) Inventors: Shuichi Mizusawa, Sayama (JP); Takehiro Takahashi, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 288 days.

(21) Appl. No.: 13/338,949

(22) Filed: Dec. 28, 2011

(65) Prior Publication Data

US 2012/0176004 A1    Jul. 12, 2012

(30) Foreign Application Priority Data

Jan. 12, 2011    (JP) .................................. 2011-003801

(51) Int. Cl.
  *H03H 9/19*    (2006.01)
  *H03H 9/17*    (2006.01)

(52) U.S. Cl.
  CPC ........ *H03H 9/177* (2013.01); *H03H 9/19* (2013.01)
  USPC .......................................... 310/344; 310/361

(58) Field of Classification Search
  CPC .............. H03H 9/0595; H03H 9/1035; H03H 2003/0428; H03H 2003/0478; H03H 2003/0485; H03H 2003/0435
  USPC .................... 310/344, 348, 360, 361, 365
  See application file for complete search history.

(56) References Cited

U.S. PATENT DOCUMENTS 6,590,315 B2 * 7/2003 Beaver ........................ 310/348
7,608,987 B2 * 10/2009 Naito et al. .................... 310/361
7,732,995 B2 * 6/2010 Tsuchido et al. .............. 310/348
7,745,979 B2 * 6/2010 Tsuchido ....................... 310/365

* cited by examiner

*Primary Examiner* — J. San Martin
(74) *Attorney, Agent, or Firm* — Klarquist Sparkman, LLP

(57) ABSTRACT

Quartz-crystal vibrating devices are disclosed, including vibrating and frame portions separated by a through-slot. An edge surface of the slot has a protrusion preventing unwanted formation of artifact "electrodes." The vibrating portion and frame are made of AT-cut quartz as a unit. A joining portion couples the frame and vibrating portion together across the through-slot. A package base has two external electrodes. A third frame region has first and second plane surfaces. The protrusion projects toward the vibrating portion and has first and/or second sloped surfaces. First and second extraction electrodes extend from respective excitation electrodes via respective joining portions to respective external electrodes. The extraction electrodes pass across the first plane surface and first sloped surface or across the second plane surface and second slanted surface.

7 Claims, 13 Drawing Sheets

100

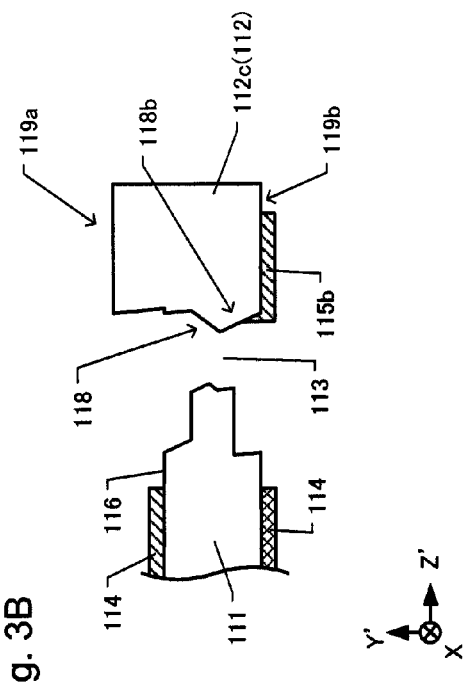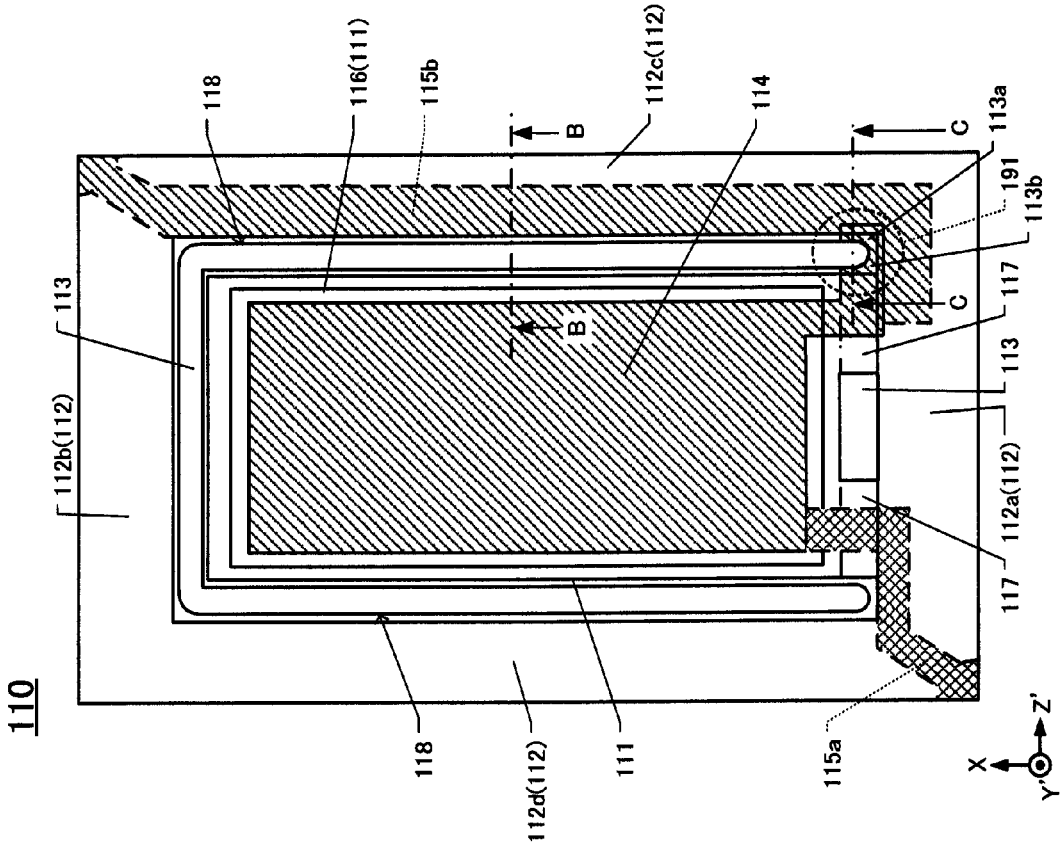

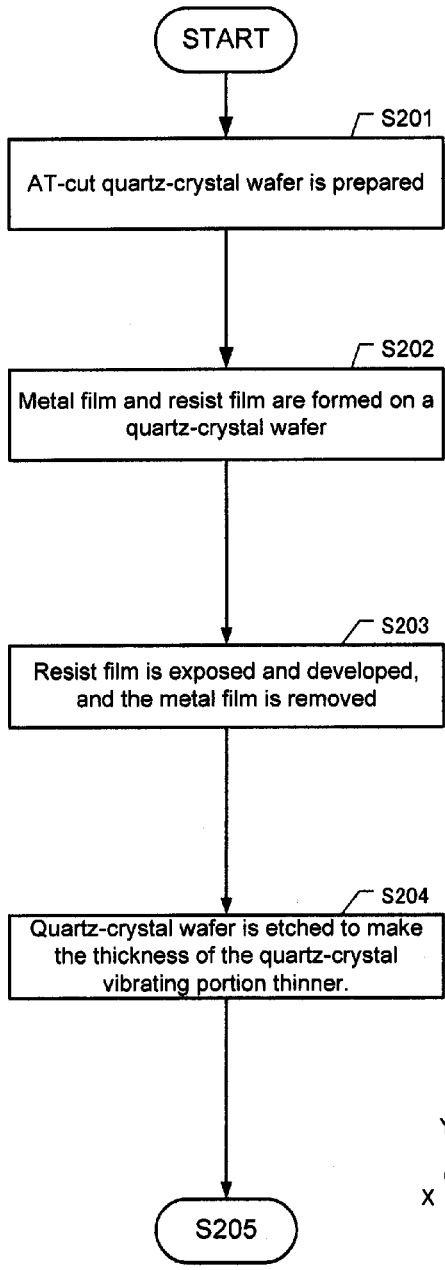
Fig. 6A
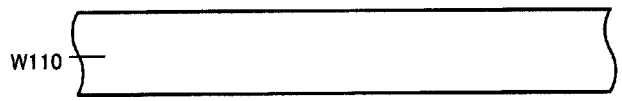
Fig. 6B
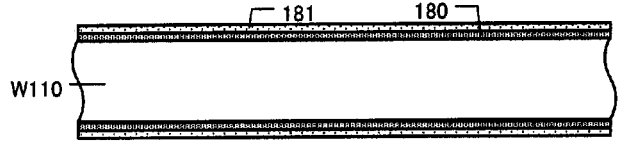
Fig. 6C
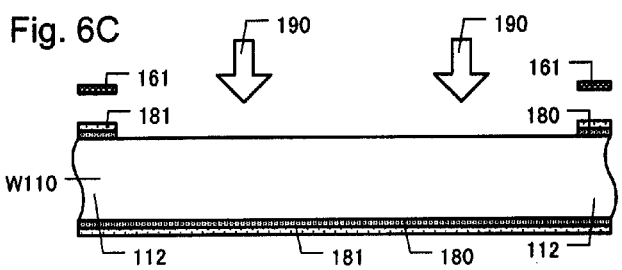
Fig. 6D
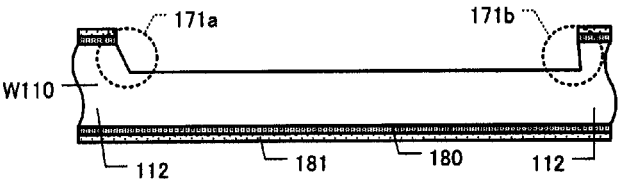
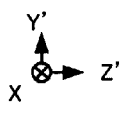

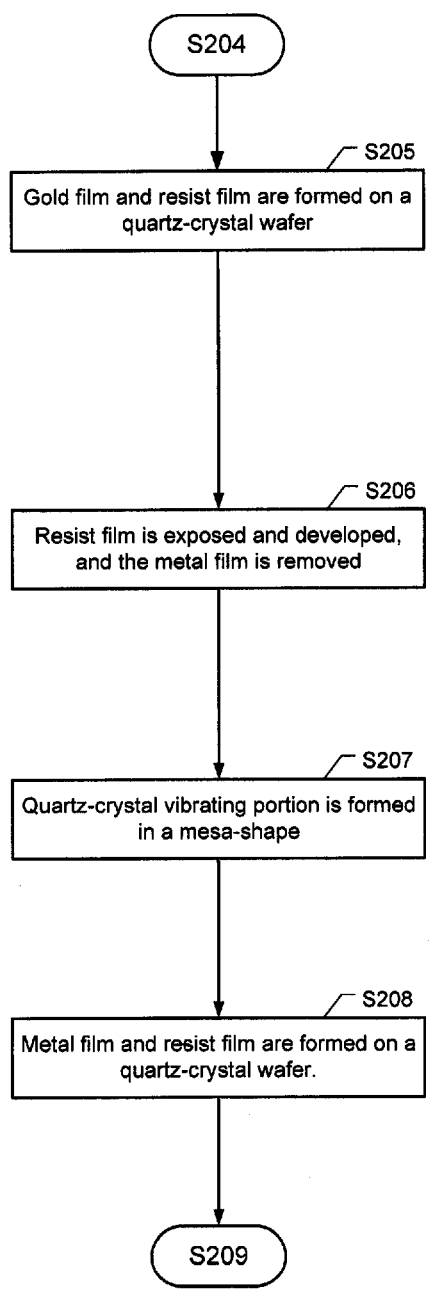
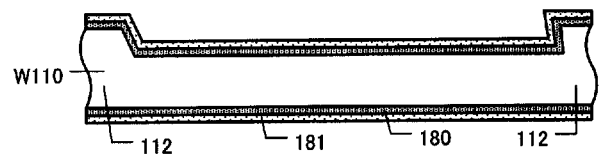
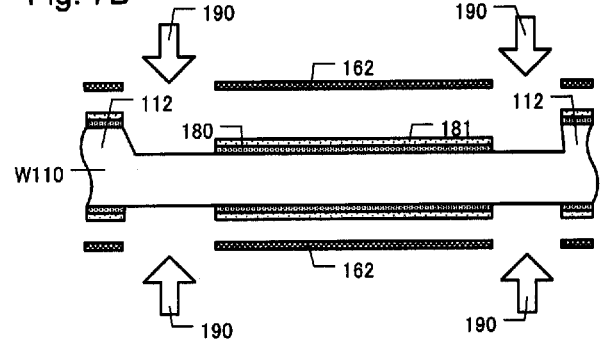
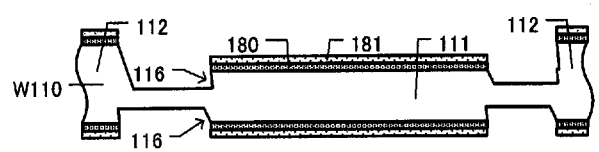
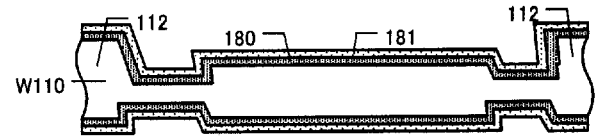
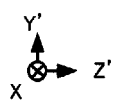

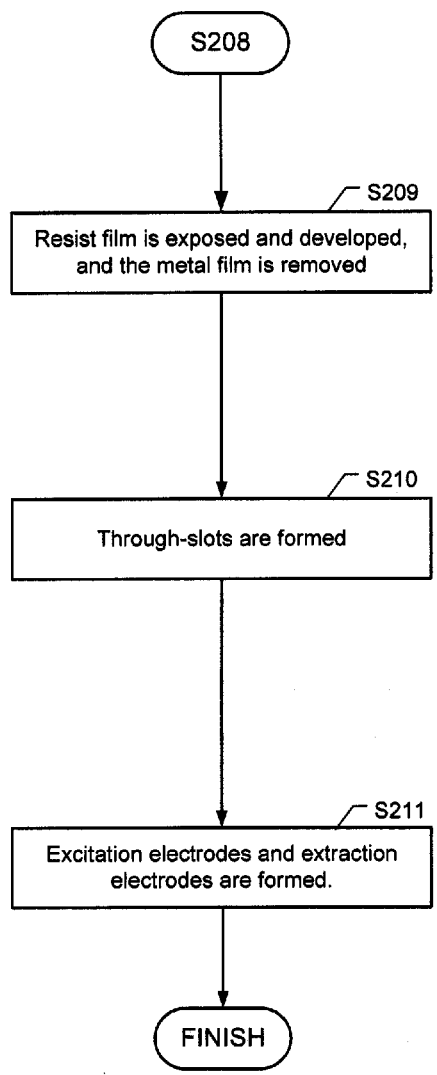
Fig. 8A
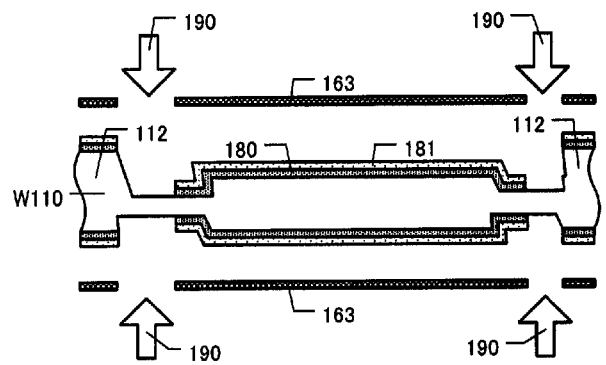
Fig. 8B
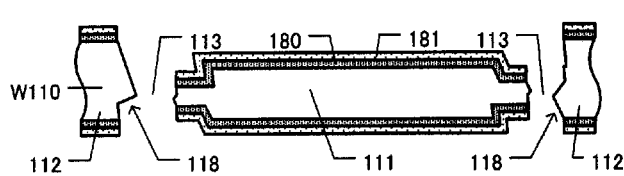
Fig. 8C
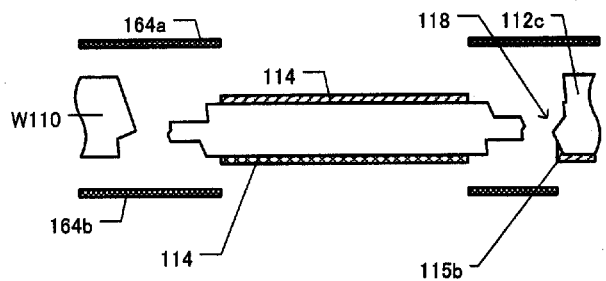
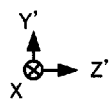

W120

_US 8,773,005 B2_

QUARTZ-CRYSTAL DEVICES EXHIBITING REDUCED ELECTRICAL IMPEDANCE

CROSS-REFERENCE TO RELATED APPLICATION

This application claims priority to and the benefit of Japan Patent Application No. 2011-003801, filed on Jan. 12, 2011, in the Japan Patent Office, the disclosure of which is incorporated herein by reference in its entirety.

FIELD

The present disclosure relates to, inter alia, AT-cut quartz-crystal devices having a quartz-crystal vibrating portion separated, at least in part, from a surrounding quart-crystal frame portion by a through-slot.

DESCRIPTION OF THE RELATED ART

Conventional quartz-crystal devices include a vibrating portion that vibrates when electrically energized and a frame portion surrounding the vibrating portion. The combination of a vibrating portion and its frame portion is termed a "quartz-crystal frame." By forming multiple quartz-crystal frames on a wafer, quartz-crystal devices can be mass-produced on a wafer scale.

Regarding a quartz-crystal frame, the vibrating portion and the frame portion are formed on a wafer and defined in part by a through-slot extending through the thickness dimension of the wafer around at least three edges of the vibrating portion. The vibrating portion includes excitation electrodes for causing the vibrating portion to vibrate. Each excitation electrode is connected to a corresponding extraction electrode situated on the frame portion. (Usually there are two excitation electrodes and two corresponding extension electrodes.) These electrodes are usually formed by sputtering according to a pattern defined by a mask. However, a mask that is misaligned during sputtering causes the particles of sputtered metal to spread undesirably via the through-slots, which forms "electrodes" at undesired positions.

A conventional way in which to prevent misalignment of the sputtering mask is to form a blockade on the through-slot that prevents the sputtered metal particles from spreading there. An example of such a blockade is disclosed in Japan Unexamined Patent Application No. 2010-147627, in which protruding portions are formed on edge surfaces of the through-slots on the frame portion. Unfortunately, the extraction electrodes are formed only on protruding portions of the frame portion, which tends to make the surface area of the extraction electrodes small. Smaller extraction electrodes have greater electrical impedance, which can degrade the vibrating characteristics of the vibrating portion.

In view of the foregoing, the present invention provides, inter alia, quartz-crystal devices of which the electrical impedance is reduced by forming respective protruding portions on the edge surfaces of each through-slot of each frame portion. The protruding portions suppress the formation of unnecessary electrodes in unnecessary regions, and suppress formation of extraction electrodes on the front surfaces of the frame portion.

SUMMARY

Among various aspects of the invention, according to one aspect, quartz-crystal devices are provided. An exemplary embodiment of such a device comprises an AT-cut quartz-crystal frame including a rectangular quartz-crystal vibrating portion, a rectangular frame portion surrounding the vibrating portion, and at least one joining portion. The vibrating portion has first, second, third, and fourth edges and first and second principal surfaces. The principal surfaces each include a respective excitation electrode. The frame portion comprises first, second, third, and fourth frame regions that are coupled together to form the rectangular frame, wherein the first frame region is coupled at a right angle to the third frame region, the third frame region is coupled at a right angle to the second frame region, the second frame region is coupled at a right angle to the fourth frame region, and the fourth frame region is coupled at a right angle to the first frame region. Thus, the first, second, third, and fourth frame regions are adjacent respective edges of the rectangular frame portion. The at least one joining portion couples the vibrating portion to the frame portion at or near the first frame region. This embodiment also includes a package base bonded to the frame portion. The package base includes first and second external electrodes situated at respective sites on an external principal surface of the package base. The first and second external electrodes are electrically connected via respective extraction electrodes to respective excitation electrodes on the vibrating portion. The third frame region near its coupling with the first frame region includes a depth dimension and first and second plane surfaces that are parallel to respective principal surfaces of the vibrating portion. The third frame region also has an edge surface that extends into the depth dimension and faces a corresponding edge surface of the vibrating portion. The edge surface of the third frame region includes one or both of first and second sloped surfaces extending into the depth dimension from the first plane surface and second plane surface, respectively, to form a protrusion that projects toward the corresponding edge surface of the vibrating portion. The frame portion comprises a first extraction electrode extending a joining portion from a respective excitation electrode to a respective external electrode. A second extraction electrode extends from a respective excitation electrode to a respective external electrode via a joining portion, the first plane surface and the protrusion, or the second plane surface and the protrusion.

The AT-cut quartz-crystal frame includes a thickness dimension and desirably defines a through-slot extending through the thickness dimension along at least three edges of the vibrating portion between the vibrating portion and corresponding regions of the frame portion. In these embodiments the second extraction electrode extends from the first principal surface to the second principal surface, or from the second principal surface to the first principal surface, via the through-slot.

In some embodiments the through-slot includes a corner thereof, having an angle less than 90°, formed at a conjunction of two or more of a joining portion, the first frame region, the second frame region, and the third frame region. A portion of the through-slot through which the second extraction electrode passes can include the corner.

For convenience, the longitudinal direction of the AT-cut quartz-crystal frame is denoted the X-axis direction, the thickness direction is denoted the Y'-axis direction, and the short direction is denoted the Z'-axis direction. The frame portion is formed by wet-etching, resulting in the first frame region and second frame region extending in the Z'-axis direction, and the third frame region extending in the X-axis direction.

In the various embodiments summarized above, quartz-crystal devices are provided that have the protrusion located on an edge surface of the frame portion facing the through-slot. This configuration prevents the formation of "electrodes" (unwanted metal deposits on unnecessary locations, which suppressing the electrical impedance of the extraction electrodes.

BRIEF DESCRIPTION OF THE DRAWINGS

FIG. 3A is a plan view of the quartz-crystal frame of the first embodiment.

FIG. 3B is a cross-sectional view along the line B-B in FIG. 3A.

FIG. 3C is a cross-sectional view along the line C-C in FIG. 3A.

FIG. 6 is a flow-chart of an exemplary method for manufacturing the quartz-crystal wafer of FIG. 5, wherein FIGS. 6A-6D depict the result of the corresponding step.

FIG. 7 is a continuation of the flow-chart of FIG. 6, wherein FIGS. 7A-7D depict the result of the corresponding step.

FIG. 8 is a continuation of the flow-chart of FIG. 7, wherein FIGS. 8A-8C depict the result of the corresponding step.

DETAILED DESCRIPTION

Various representative embodiments are described below with reference to the respective drawings. It will be understood that the scope of the disclosure is not limited to the described embodiments, unless otherwise stated.

First Embodiment of Quartz-Crystal Device

Figure 1:
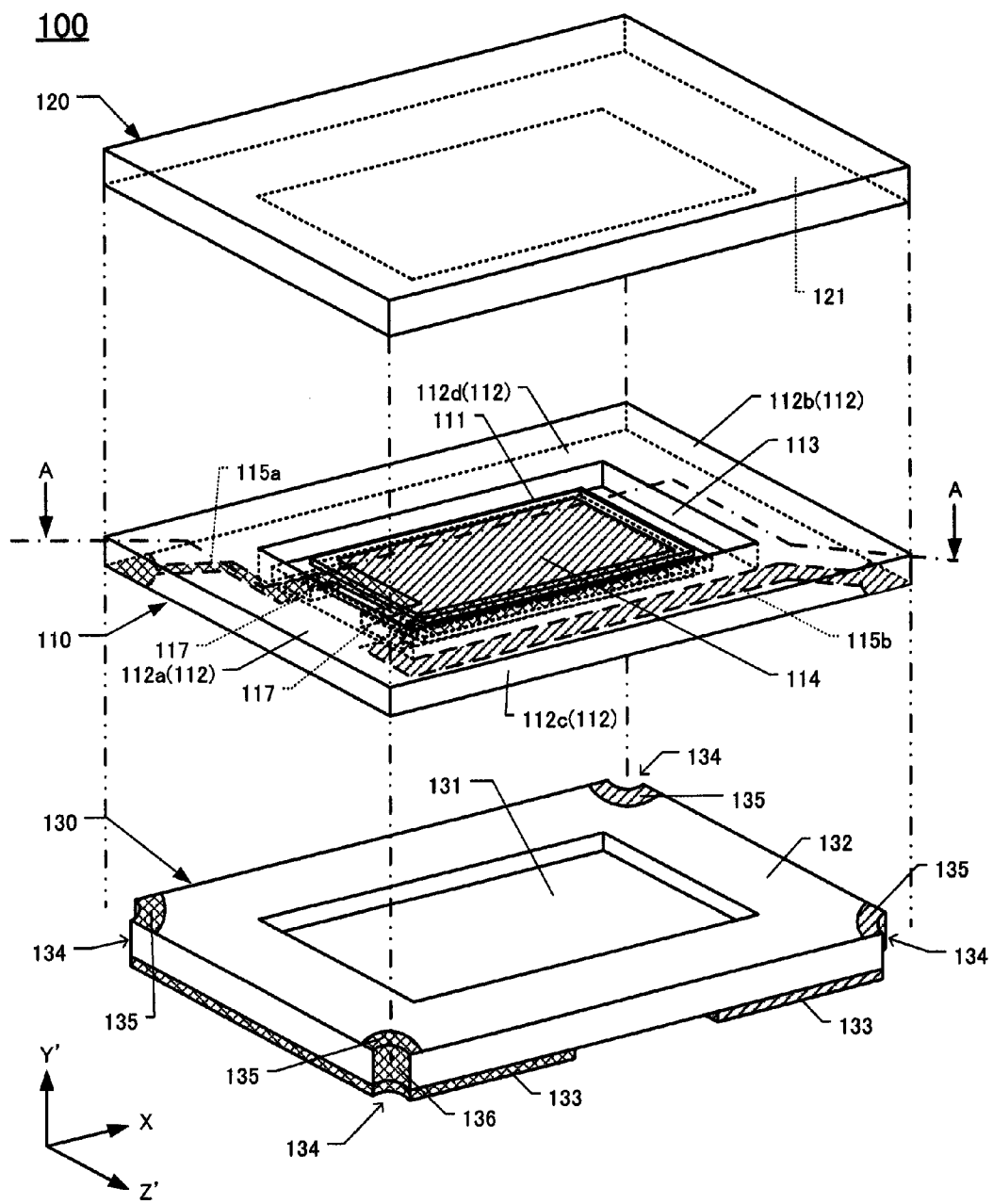
FIG. 1 is an exploded perspective view of a first embodiment of a quartz-crystal device.

FIG. 1 is an exploded perspective view of a quartz-crystal device 100 according to this embodiment. The quartz-crystal device 100 is a surface-mountable quartz-crystal device that can be mounted on, for example, a "printed" substrate such as printed circuit boards. The quartz-crystal device 100 comprises a quartz-crystal frame 110, a package lid 120, and a package base 130. The quartz-crystal frame 110 is fabricated from an AT-cut quartz-crystal material. An AT-cut quartz-crystal material has a principal surface (in the YZ plane) that is tilted by 35° 15' about the Y-axis of a crystal-coordinate system (XYZ) in the direction of the Y-axis from the Z-axis around the X-axis. In the following description, new axes tilted with respect to the axial directions of the quartz-crystal material are denoted as the Y'-axis and Z'-axis, respectively. Therefore, in the quartz-crystal device 100, the longitudinal direction of the piezoelectric device is the X-axis direction, the height direction is the Y'-axis direction, and the direction perpendicular to the X-axis and Y'-axis directions is the Z'-axis direction.

The quartz-crystal frame 110 comprises a vibrating portion 111 that vibrates when electric voltage is applied to it. The quartz-crystal frame 110 also comprises a frame portion 112 surrounding the vibrating portion 111. A pair of joining portions 117 connects the vibrating portion 111 to the frame portion 112. Between the vibrating portion 111 and frame portion 112 is a through-slot 113 extending through the Y'-axis direction (thickness direction) of the quartz-crystal frame 110 and extending around at least three edges of the vibrating portion 111.

Hereinafter, the region of the frame portion 112 extending in the −X-axis direction is denoted as the first region 112a, the region extending in the +X-axis direction is denoted the second region 112b, the region in the +Z'-axis direction is denoted the third region 112c, and the region in the −Z'-axis direction is denoted the fourth region 112d. The vibrating portion 111 is connected to the first region 112a by the joining portions 117. A respective excitation electrode 114 is situated on the +Y'-surface and −Y'-surfaces of the vibrating portion 111. The quartz-crystal frame 110 also comprises a first extraction electrode 115a, which is connected to the excitation electrode 114 on the −Y'-surface of the vibrating portion. The first extraction electrode 115a passes over a respective joining portion 117 to the (−Z', −X) corner of the frame portion 112. The quartz-crystal frame 110 also comprises a second extraction electrode 115b, which is connected to the excitation electrode 114 on the +Y'-surface of the vibrating portion. The second extraction electrode 115b passes over a respective joining portion 117 and then crosses through the thickness dimension from the +Y'-surface to the −Y'-surface of the quartz-crystal frame 110 via a respective terminus of the through-slot 113. The second extraction electrode 115b also extends on the −Y'-surface of the quartz-crystal frame 110 over the first region 112a and third region 112c to the +Z', +X) corner of the frame portion 112.

The package lid 120 is a planar board without any concavity of convexity on either the +Y'-surface or −Y'-surface thereof. In FIG. 1, the package lid 120 is disposed in the +Y'-axis direction relative to the quartz-crystal frame 110. A bonding surface 121 (FIG. 2) is disposed on the −Y'-surface of the package lid 120 for bonding to the regions 112a, 112b, 112c, 112d of the frame portion 112.

The package base 130 is disposed in the −Y'-axis direction relative to the quartz-crystal frame 110. The package base 130 defines a recess 131 and a bonding surface 132 on the +Y'-surface thereof. A respective conductive pad 135 is located on the +Y'-surface at each corner of the package base 130. The conductive pads 135 (and respective electrodes 136 in respective castellations 134) provide respective electrical connections from the +Y-surface to the −Y-surface of the package base 130. The conductive pads 135 on the −X-corners of the package base 130 are connected together on the −Y-surface of the package base 130 by an external electrode 133. Similarly, the conductive pads 135 on the +X-corners of the package base 130 are connected together on the −Y-surface of the package base 130 by an external electrode 133. Thus, the castellation electrodes 136 are electrically connected to respective conductive pads 135 on the +Y'-surface and to an external electrode 133 on the −Y'-surface of the package base 130.

Figure 2:
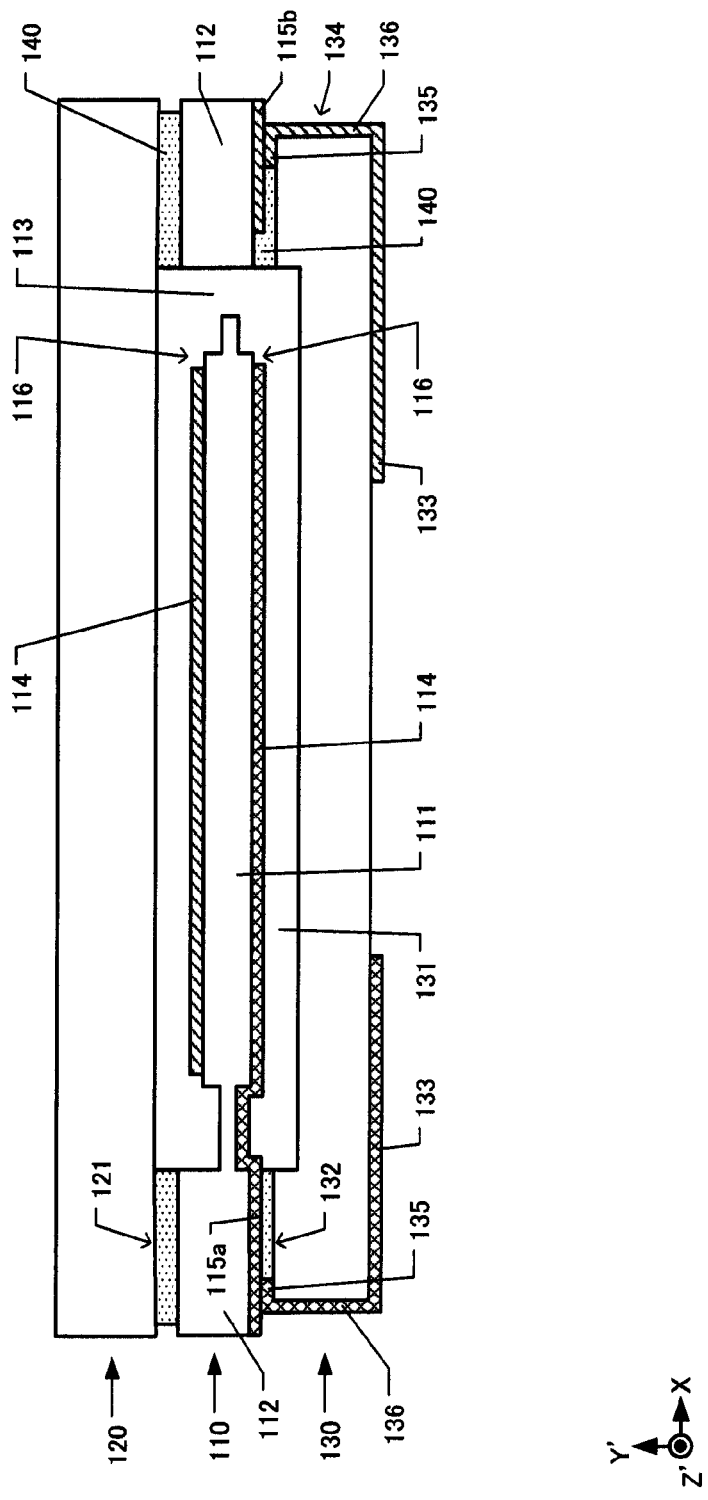
FIG. 2 is a cross-sectional view along the line A-A in FIG. 1.

FIG. 2 is a cross-sectional view of the device 100 along the line A-A in FIG. 1. The package lid 120 is situated on the +Y'-side of the quartz-crystal frame 110, and the package base 130 is situated on the −Y'-side of the quartz-crystal frame. The bonding surface 121 of the package lid 120 and the bonding surface 132 of the package base 130 are bonded to respective opposing surfaces of the frame portion 112 using a sealing material 140. Also visible in FIG. 2 are the first and second extraction electrodes 115a, 115b. These extraction electrodes, formed on the −Y'-surface of the quartz-crystal frame 110, are connected to respective conductive pads 135 on the +Y'-surface of the package base 130. Thus, the excitation electrodes 114 on the vibrating portion 111 are electrically connected to respective external electrodes 133, situated on the outer (lower) principal surface of the package base 130, by respective extraction electrodes 115a, 115b, conductive pads 135, and castellation electrodes 136.

As shown in FIG. 2, the vibrating portion 111 is thinner than the frame portion 112 and is displaced, in the −Y'-direction, relative to the frame portion 112 toward the recess 131 in the package base 130. Also, the vibrating portion 111 is mesa-shaped, having central ("mesa") regions 116 on each of the −Y'- and +Y'-surfaces thereof. Thus, the vibrating portion 111 is thicker in the Y'-axis direction in the mesa regions 116 than in the peripheral regions surrounding the mesa regions. The excitation electrodes 114 are situated on respective mesa regions 116.

FIG. 3A is a plan view of the quartz-crystal frame 110, which comprises a vibrating portion 111, a frame portion 112, and joining portions 117 that couple the vibrating portion 111 to the first region 112a of the frame portion 112. Visible is the through-slot 113 situated between the vibrating portion 111 and the frame portion 112 and extending around three sides of the vibrating portion. The vibrating portion 111 is mesa-shaped on both its +Y'-surface and −Y'-surface, and a respective excitation electrode 114 is situated on each mesa surface 116. Each excitation electrode is surrounded by a thin periphery of the vibrating portion 111. A respective extraction electrode 115a, 115b is connected to each excitation electrode 114. The first extraction electrode 115a connects to the excitation electrode 114 on the −Y'-surface of the vibrating portion 111 and extends across a respective joining portion 117 to the (−X, −Z') corner of the frame portion 112 as shown. The second extraction electrode 115b connects to the excitation electrode 114 on the +Y'-surface of the vibrating portion 111 and extends across a respective joining portion 117 to the adjacent end of the through-slot 113, through the through-slot 113 onto the −Y'-surface of the frame portion 112, and then to the (+X, +Z') corner of the frame portion 112.

In a vertical profile, the through-slot 113 is defined by edge walls (FIG. 3B). The edge wall on the frame portion 112 includes a protrusion 118 extending toward the opposing edge of the vibrating portion 111. The opposing edge wall on the vibrating portion 111 protrudes toward the edge wall of the frame portion 112. The second extraction electrode 115b in the third region 112c of the frame portion 112 extends partially over the protruding portion 118. At the respective terminus of the through-slot 113 the second extraction electrode 115b passes from the +Y'-surface to the −Y'-surface of the quartz-crystal frame 110 (FIG. 3C, detailing the region encircled by the dotted line 191 in FIG. 3A). This terminal region of the through-slot 113 includes a first edge projection 113a located adjacent the juncture of the first region 112a and third region 112c of the frame portion 112, and a second edge projection 113b located adjacent the juncture of the joining portion 117 and the first region 112a of the frame portion. These edge projections 113a, 113b present angles that are less than 90° relative to the +Y'-surface or −Y'-surface of the quartz-crystal frame 110. Also, in these edge projections 113a, 113b the protrusion 118 projects outward more than in other regions (e.g., FIG. 3B). Consequently, a metal film destined to become an electrode in an edge projection 113a, 113b can be easily deposited or otherwise formed on side walls of the through-slot 113. These electrodes, for conducting electrical energy from the +Y'-surface to the −Y'-surface for example, are located at the terminus of the through-slot 113.

FIG. 3B is a cross-sectional view of FIG. 3A along the line B-B. In this figure the +Y'-surface of the frame portion 112 is denoted the first plane surface 119a, and the −Y'-surface of the frame portion is denoted the second plane surface 119b. The edge surface of the through-slot 113 in this area includes the inclined-surface protrusion 118. One portion 118b of the protrusion 118 is joined to the second plane surface 119b, and is called a second inclined slanted surface 118b. The second extraction electrode 115b on the second plane surface 119b extends onto the second inclined surface 118b.

FIG. 3C is a cross-sectional view of FIG. 3A along the line C-C. In this region the second extraction electrode 115b connects from the +Y'-surface to the −Y'-surface of the frame portion 112 via the first and second edge projections 113a, 113b in the through-slot 113. In these edge projections 113a, 113b the protrusion 118 has relatively large width (in the X×Z' plane) to facilitate formation of a metal film that extends completely through the through-slot 113.

Exemplary Method for Manufacturing Quartz-Crystal Device

Figure 4:
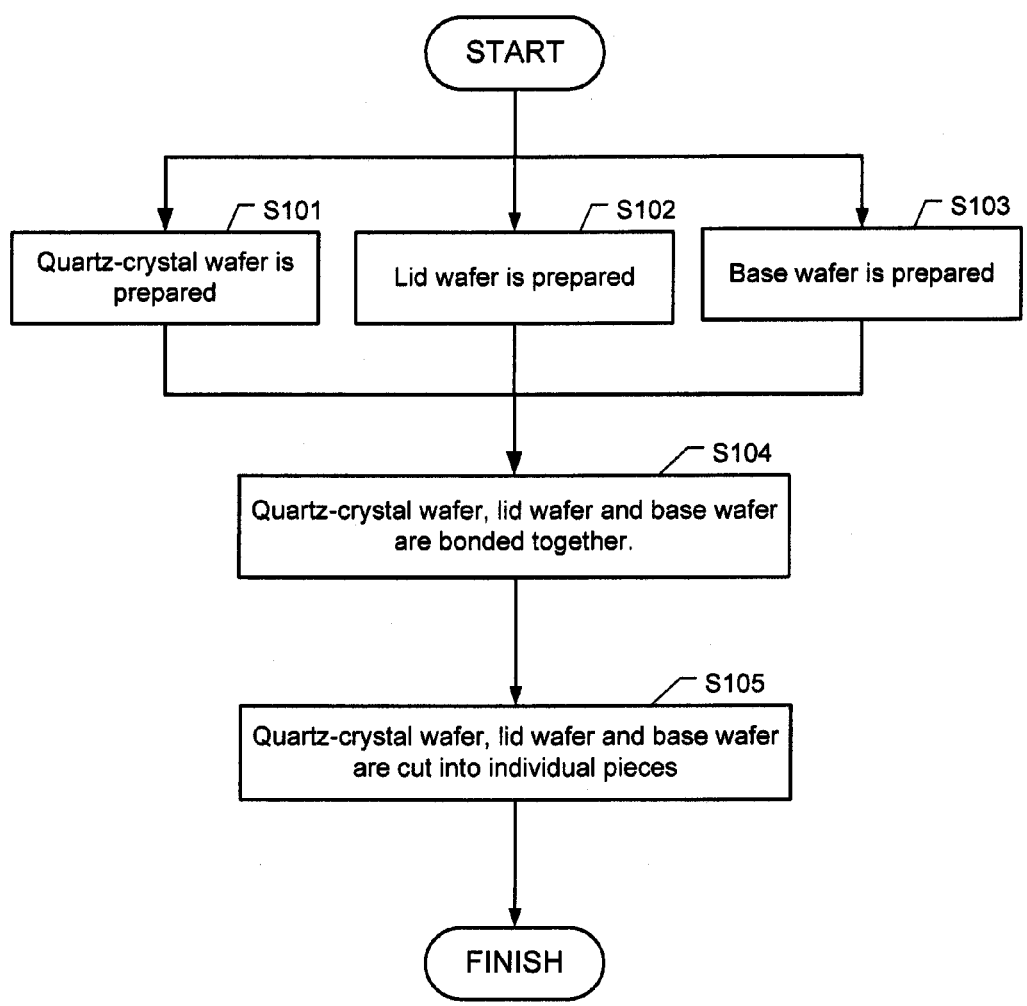
FIG. 4 is a flow-chart of an exemplary method for manufacturing the quartz-crystal device of the first embodiment.

A flow-chart of this exemplary method for manufacturing the first embodiment of a quartz-crystal device 100 is shown in FIG. 4. In step S101 a quartz-crystal wafer W110 is fabricated from an AT-cut quartz-crystal material. Multiple quartz-crystal frames 110 are formed on a quartz-crystal wafer W110 (further details of which are described below with reference to FIG. 5). Further details of a method for manufacturing the quartz-crystal wafer W110 are described later below with reference to FIGS. 6-8.

Figure 5:
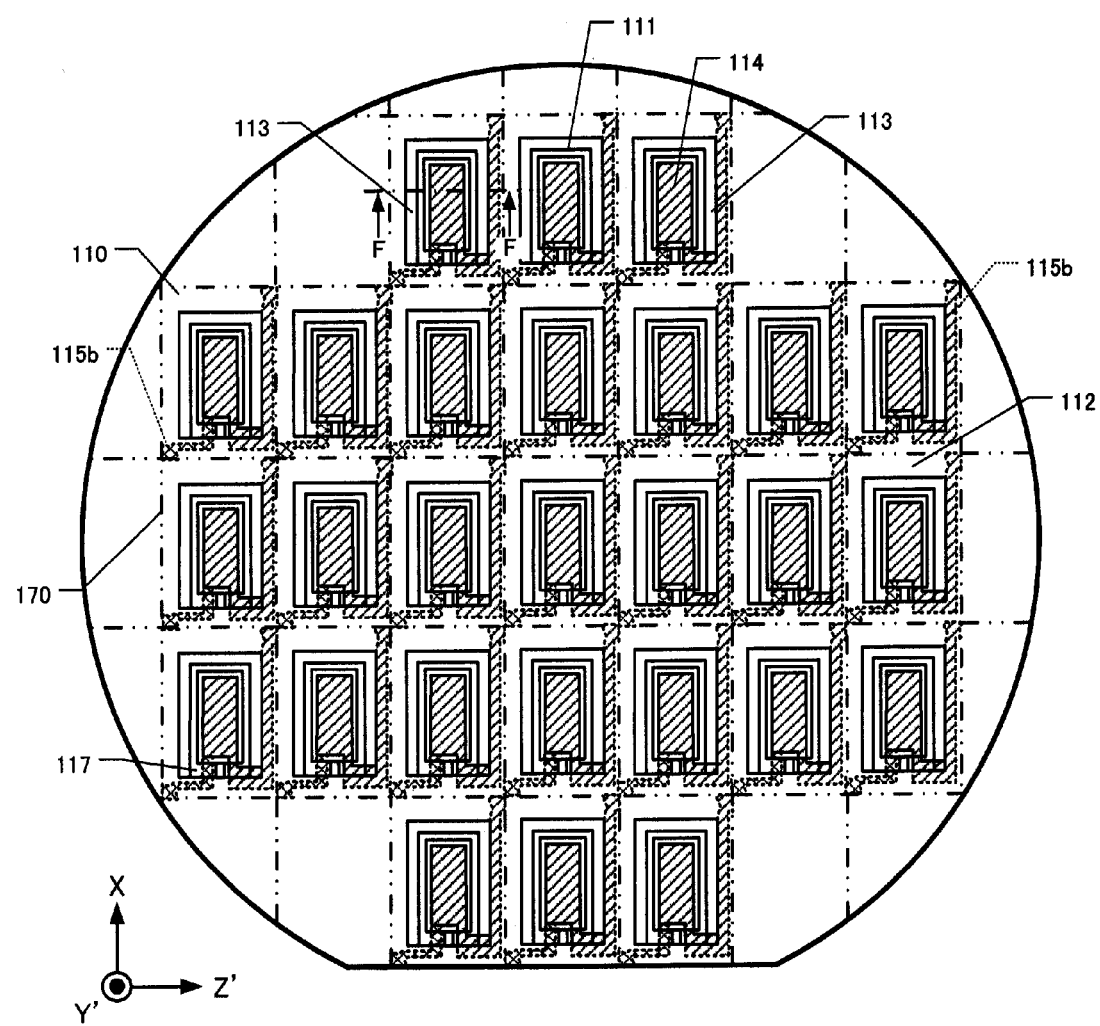
FIG. 5 is a plan view of a quartz-crystal wafer on which multiple quartz-crystal devices according to the first embodiment are formed.

FIG. 5 is a plan view of the +Y'-surface of the quartz-crystal wafer W110. Multiple quartz-crystal frames 110 have been formed on the wafer W110. In FIG. 5, the borders of adjacent quartz-crystal frames 110 are indicated by dash-dot lines. Each dash-dot line is a scribe line 170 used as a reference for separating individual devices in step S105 of FIG. 4. Each quartz-crystal frame 110 comprises a respective vibrating portion 111, frame portion 112, through-slot 113, and joining portions 117. Each vibrating portion 111 includes a respective excitation electrode 114 on the +Y'-surface and −Y'-surface thereof. A respective extraction electrode 115a, 115b is connected to each excitation electrode 114.

FIGS. 6-8 are flow-charts of steps in an exemplary method for manufacturing the quartz-crystal wafer W110. The steps shown in FIGS. 6-8 are particularly directed to forming the vibrating portions 111 and through-slots 113. In FIGS. 6-8 each step includes a respective cross-section depicting the result of the step. The cross-sections shown in FIGS. 6-8 are of the quartz-crystal wafer W110 along the line F-F in FIG. 5.

In step S201 of FIG. 6, an AT-cut quartz-crystal wafer W110 is prepared. FIG. 6A is a cross-sectional view of the AT-cut quartz-crystal wafer W110 as prepared. The quartz-crystal wafer W110 has principal surfaces on its +Y'-surface and on its −Y'-surface. Both surfaces are planar, without concavities or convexities.

In step S202 a metal film 180 and a resist film 181 are sequentially formed on both principal surfaces of the quartz-crystal wafer W110. FIG. 6B is a cross-section of the quartz-crystal wafer W110 after application of the metal film 180 and the resist film 181. The metal film 180 comprises a foundation layer of chromium (Cr) formed on both principal surfaces of the quartz-crystal wafer W110. An overlying layer of gold (Au; not shown) is formed on the surface of the chromium layer. A resist film 181 is formed on the surface of the metal film 180. The resist film 181 is, for example, a positive photoresist that acquires, when exposed, a high solubility in developing solution.

In step S203 the resist film 181 on the upper surface of the wafer is exposed and developed, followed by removal of the metal film 180. Specifically, in this step, the metal film 180 and resist film 181 (formed on the +Y'-surface and defining the vibrating portion 111 and the through-slot 113 in FIG. 3A) are removed after exposure, except from regions of the wafer corresponding to the frame portion 112. FIG. 6C is a cross-sectional view of the quartz-crystal wafer W110 after exposing and developing the resist film 181 and after removing unprotected regions of the metal film 180. Also in this step S203, a first mask 161 is placed on the +Y'-surface of the quartz-crystal wafer W110. The first mask 161 extends over the +Y'-surface wherever frame portions 112 have been formed. After placing the first mask 161, a UV exposure light 190 is irradiated onto the +Y'-surface of the quartz-crystal wafer W110 to expose the resist film 181 in regions unprotected by the first mask 161. The exposed resist film 181 is immersed in developer (not shown) to remove it from the wafer surface.

In step S204 the unprotected regions of the metal film 180 are wet-etched to produce reduced-thickness vibrating portions 111 (see FIG. 3A). FIG. 6D is a cross-sectional view of the quartz-crystal wafer W110 after performing this thickness-reducing etching step. In step S204 the +Y'-surface of the quartz-crystal wafer W110 (except for frame portions 112) is wet-etched, which reduces the thickness of the regions in contact with the etchant. During etching of the quartz-crystal material, the etching rate varies in each of the X-axis, Y'-axis, and Z'-axis directions, which results in the wafer W110 being etched in an anisotropic manner. In FIG. 6D, the etched regions 171a and 171b (each encircled by a respective dotted-line in FIG. 6D) exhibit a sloped thickness profile due to different respective etching rates and different angles relative to the principal surfaces.

Turning now to FIG. 7, in step S205 a metal film 180 and a resist film 181 are formed on both surfaces of the quartz-crystal wafer W110. More specifically, in step S205 the metal films 180 and resist films 181 remaining from step S204 are removed, followed by application of new metal layers 180 and resist layers 181 for use in forming the mesa regions 116 on the vibrating portion 111. FIG. 7A is a cross-sectional view of the quartz-crystal wafer W110, on which new films of metal 180 and resist 181 have been applied. The new metal film 180 and resist film 181 are formed on both the +Y'-surface and the −Y'-surface of the quartz-crystal wafer W110.

In step S206, the resist film 181 is exposed and developed, and resulting unprotected regions of the metal film 180 and resist film 181 are removed, except from regions defining the frame portion 112 and the mesa portion 116 (see FIG. 2) of the vibrating portion 111. FIG. 7B is a cross-sectional view of the quartz-crystal wafer W110, on which the resist film 181 has been exposed and developed, and from which the metal film 180 has been removed. Specifically, the metal film 180 and resist film 181 in the vicinity of the through-slots 113 and periphery of the vibrating portion 111 (see FIG. 3A) are removed. Respective second masks 162 are placed relative to the +Y'-surface and −Y'-surface of the wafer W110. The second masks 162 are placed so as to superpose regions in which frame portions 112 and mesa regions 116 have been formed (see FIG. 2). After placing the second masks 162, UV exposure light 190 is irradiated onto the +Y'-surface and −Y'-surface of the wafer W110 to expose the resist. Then, the resist film 181 is immersed into developer (not shown) to remove exposed resist.

In step S207, the vibrating portion 111 is provided with a mesa-configuration. The periphery of the vibrating portion 111 (now unprotected by resist) is wet-etched to reduce the thickness of the periphery of the vibrating portion 111. FIG. 7C is a cross-sectional view of the wafer W110 showing the result of this step. Also during this step S207, regions destined to become the through-slot 113 (FIG. 3A) are wet-etched. As a result of this step, mesa regions 116 are formed on the vibrating portion 111.

In step S208, new metal film 180 and resist film 181 are sequentially formed on both surfaces of the quartz-crystal wafer W110. More specifically, after completing step S207, remaining metal film 180 and resist film 181 are removed, followed by application of new metal films 180 and resist films 181 (FIG. 3A) on both surfaces of the wafer. The new metal films and resist films are destined for use in forming the through-slots 113. FIG. 7D is a cross-sectional view of the quartz-crystal wafer W110 after formation of a new metal film 180 and new resist film 181 on the +Y'-surface and −Y'-surface of the wafer W110.

Turning now to FIG. 8, in step S209 the resist film 181 is exposed and developed, and metal film is removed. More specifically, in regions of exposed and developed resist, the metal film 180 and the resist film 181 on both surfaces of the wafer are removed. These regions are destined to be locations of the through-slot 113 (FIG. 3A). FIG. 8A is a cross-sectional view of the result of this step, showing a section of the wafer W110 from which new metal film 180, unprotected by developed resist, has been removed by etching from both surfaces of the wafer. Third masks 163 are placed relative to the +Y'-surface and −Y'-surface of the wafer W110. The third masks 163 cover the entire respective surfaces except for regions destined to become the through-slots 113 (FIG. 3A). After placing the third masks 163, UV exposure light 190 is irradiated onto both surfaces of the wafer W110 to expose the resist film 181. Exposed resist film 181 is immersed in developer (not shown), followed by removal of developed resist.

In step S210, regions of the wafer W110 unprotected by resist are wet-etched, thereby forming the through-slots 113. FIG. 8B is a cross-sectional view of the quartz-crystal wafer W110 after formation of the through-slots 113 in this step. Note that the quartz-crystal material of the wafer W110 is etched at a slope relative to principal surfaces of the wafer. This is due to the anisotropic aspect of the AT-cut quartz-crystal material. In any event, in this step the protrusions 118 are formed on the edge surfaces of the through-slots 113.

In step S211, the excitation electrodes 114, first extraction electrode 115a (see FIG. 3A) and second extraction electrode 115b are formed on the quartz-crystal wafer W110. More specifically, in this step, metal film 180 and resist film 181 remaining from step S210 are removed. The excitation electrodes 114 and extraction electrodes 115a, 115b (see FIG. 3A) are formed using respective fourth masks 164a, 164b. The result is shown in FIG. 8C. The fourth mask 164a defines an opening shaped as an excitation electrode for the +Y'-surface of the quartz-crystal frame 110, and the fourth mask 164b defines an opening shaped as an excitation electrode for the −Y'-surface of the quartz-crystal frame 110. Similar to the metal film 180 described in step S202, the excitation electrodes 114 and extraction electrodes 115a, 115b are formed on the wafer W110 as a chromium layer with overlying gold layer.

Figure 9:
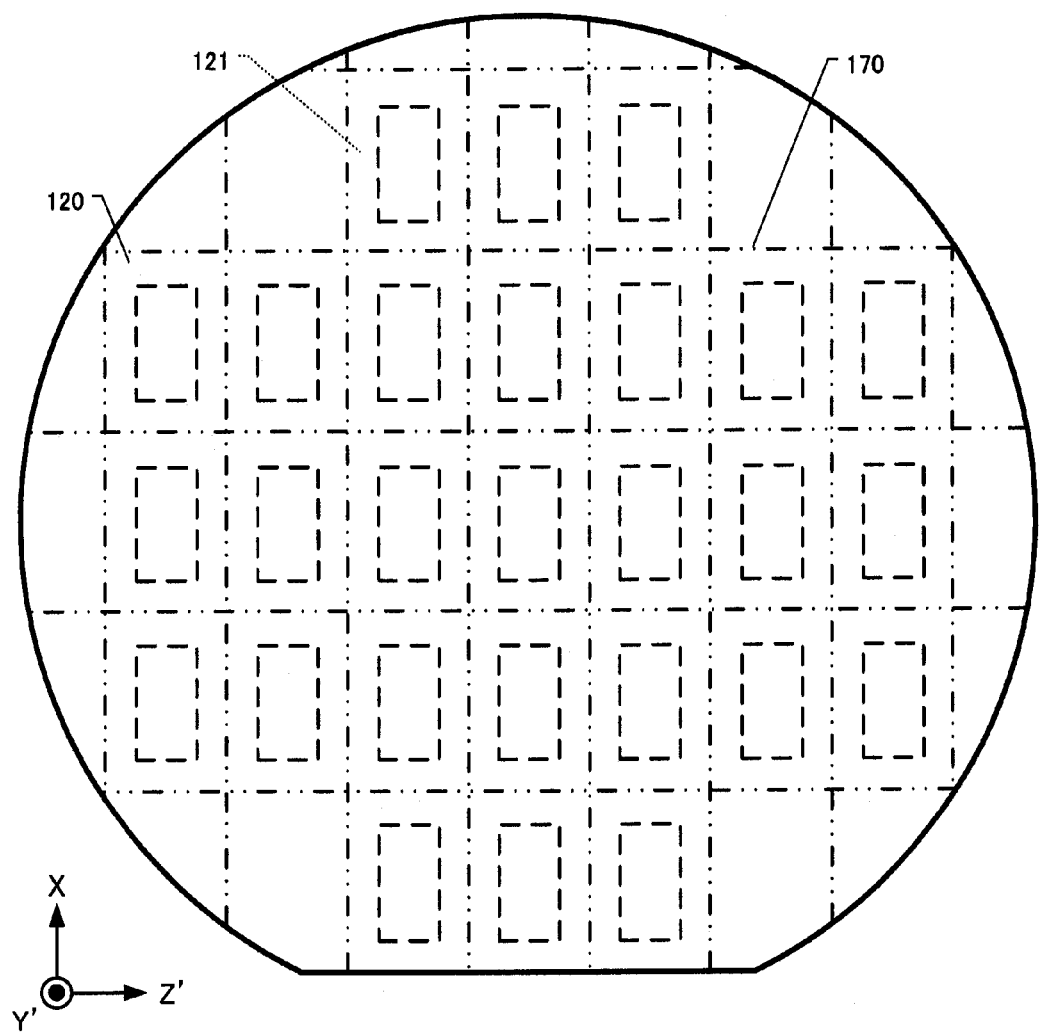
FIG. 9 is a plan view of a lid wafer used in mass-production of quartz-crystal vibrating devices.

Returning to FIG. 4, in step S102 the lid wafer W120 is prepared. Multiple package lids are formed simultaneously on the lid wafer W120. The lid wafer W120 can be fabricated of the quartz-crystal material (used for fabricating the wafer W110) or glass. An exemplary lid wafer W120 is shown in FIG. 9, in which the depicted lid wafer W120 defines multiple package lids 120. The dot-dash lines in FIG. 9 are scribe lines 170 that denote the borders of the adjacent package lids 120. During assembly of a quartz-crystal device 100, a package lid 120 is bonded to the bonding surface 121 of a frame portion 112 of a corresponding quartz-crystal frame 110. The bonding surface 121 is the −Y'-surface of the frame portion.

Figure 10:
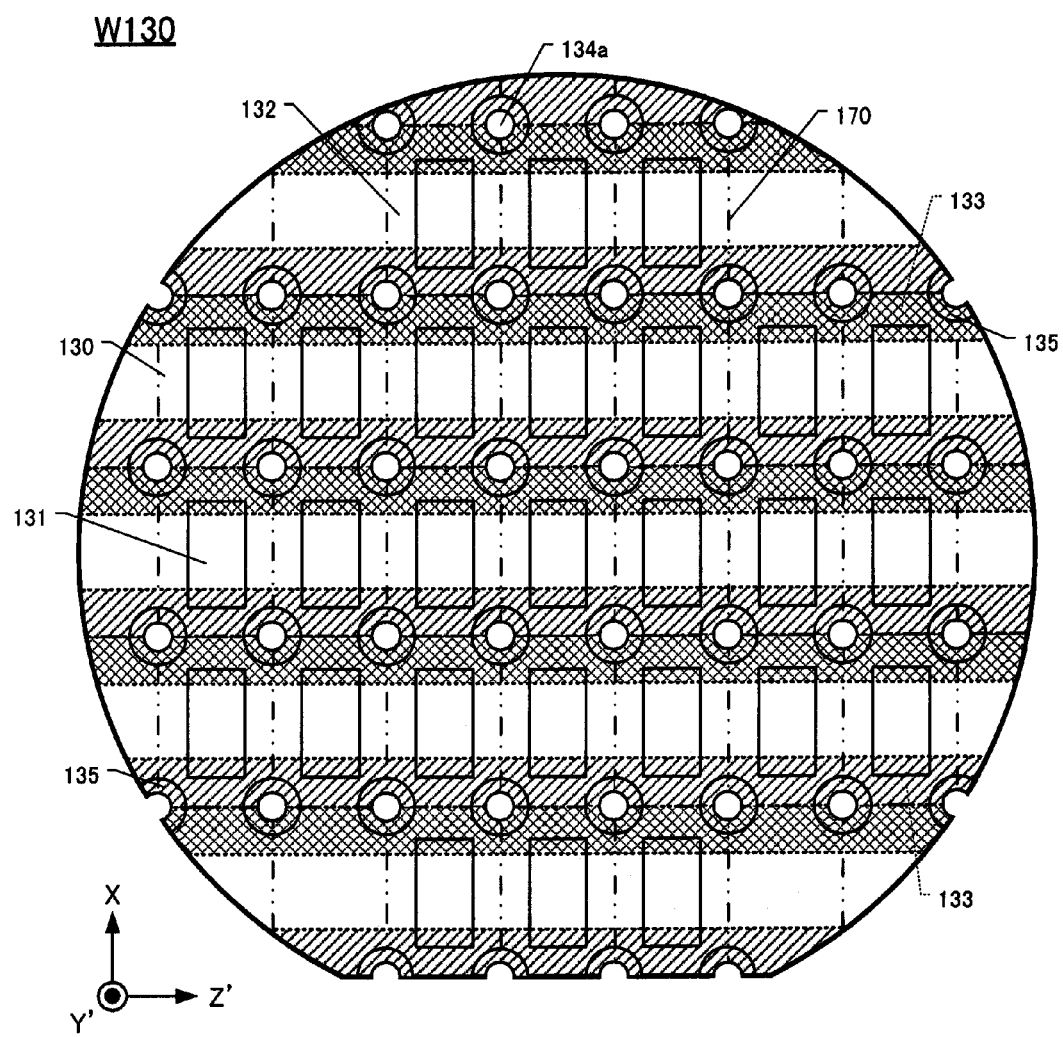
FIG. 10 is a plan view of a base wafer used in mass-production of quartz-crystal vibrating devices.

In step S103, the base wafer W130 is prepared. Multiple package bases 130 are formed simultaneously on the base wafer W130. The base wafer W130 can be fabricated of the quartz-crystal material or glass, for example. An exemplary base wafer W130 is shown in FIG. 10, in which the depicted base wafer W130 defines multiple package bases 130. The dot-dash lines 170 In FIG. 10 are scribe lines that denote the borders of the adjacent package bases 130. Each package base 130 has a −Y'-surface (outer principal surface) on which external electrodes 133 are formed. Corresponding conductive pads 135 are formed on the +Y'-axis surface. Respective scribe lines extend in the X-axis and Z'-axis directions, and respective through-holes 134a are defined at each intersection of X- and Z'-direction scribe lines 170. The through-holes 134a extend through the base wafer W130 in the Y'-axis (thickness) direction. The through-holes 134a are destined to form respective castellations 134 (see FIG. 1) during the device-separation step S105. Respective castellation electrodes 136 (see FIG. 1) are formed on the inner walls of the through-holes 134a, and respective external electrodes 133 are electrically connected to the conductive pads 135. A respective recess 131 is formed on each package base 130 facing the +Y'-direction. The bonding surfaces 132 are peripheral to the respective recesses 131.

In step S104 the quartz-crystal wafer W110, lid wafer W120, and base wafer W130 are bonded together as a three-wafer sandwich. For bonding, the frame portion 112 of the quartz-crystal wafer W110, the bonding surface 121 of the lid wafer W120, and the bonding surface 132 of the base wafer W130 are aligned with each other along the Y'-axis. These surfaces are bonded together using the sealing material 140 (see FIG. 2) to form a three-wafer sandwich.

In step S105, the three-wafer sandwich is divided into individual devices by cutting along the scribe lines 170 indicated in FIGS. 5, 9, and 10. Thus, as shown in FIG. 1, multiple individual quartz-crystal devices 100 are produced.

In a quartz-crystal device 100, the protrusions 118 on the frame portion 112 block formation of the second extraction electrode 115b at undesired locations. For example, in FIG. 8C, even if the fourth mask 164b is misaligned in the −Z'-axis direction, the protrusion 118 blocks formation of the second extraction electrode 115b on the edge surface of the third region 112c. Also, the anisotropic nature of AT-cut quartz-crystal material forms the protrusion 118 during the etching step; therefore, the protrusion 118 is formed automatically without requiring an extra process step. In addition, formation of the second extraction electrode 115b on the second plane surface 119b of the third region 112c of the frame portion 112 keeps electric impedance low.

Second Embodiment of Quartz-Crystal Device

In the first embodiment of a quartz-crystal device 100, although the second extraction electrode 115b extends from the first region 112a to the second region 112b via the second plane surface 119b of the third region 112c of the frame portion 112, the electrode alternatively can extend from the first region 112a to the second region 112b via the first plane surface 119a. The second embodiment of a quartz-crystal device 200 is now described, in which the second extraction electrode extends from the first region 112a to the second region 112b via the first plane surface 119a. In the following description, features that are similar to corresponding features in the first embodiment have the same respective reference numerals.

Figure 11:
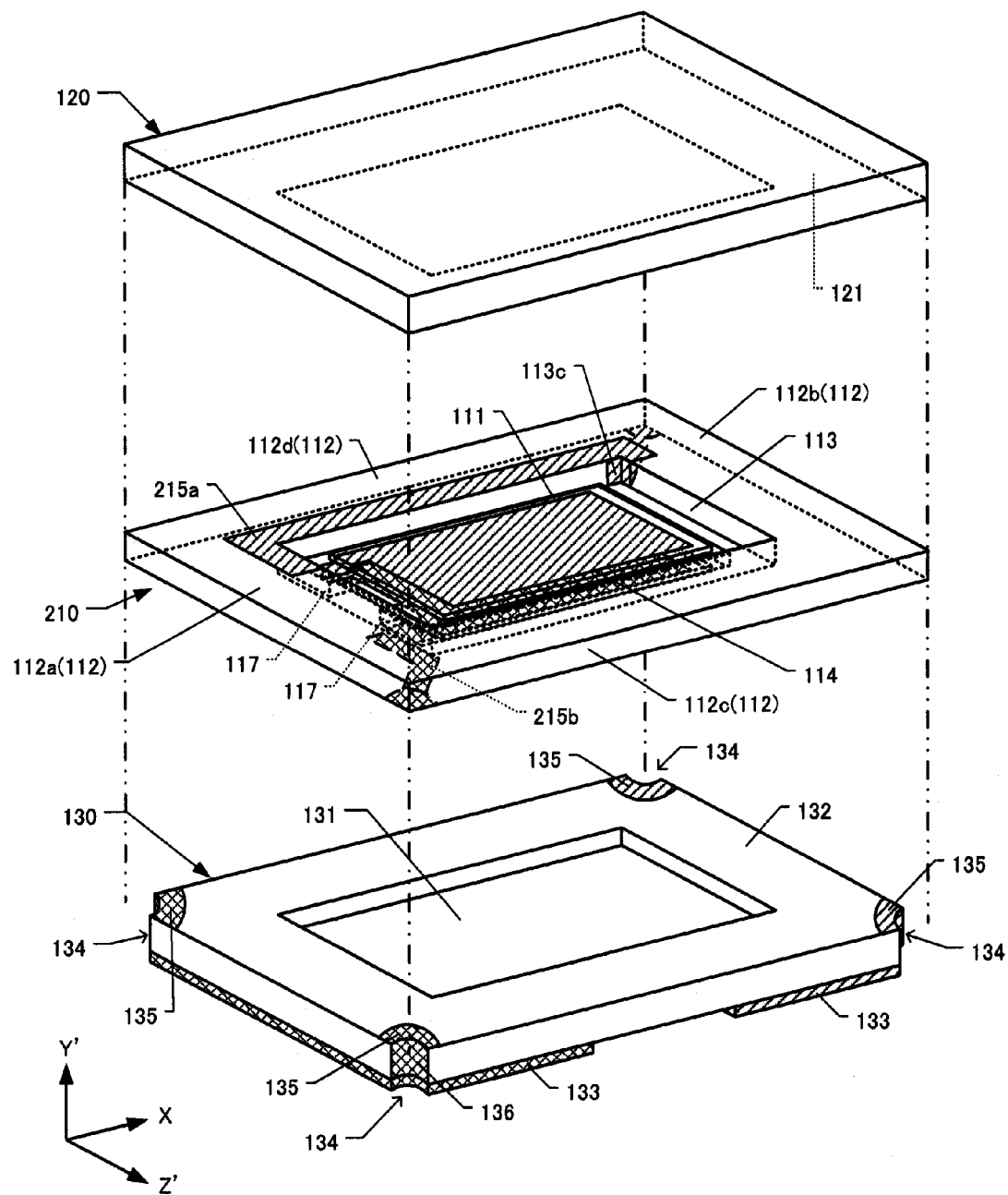
FIG. 11 is an exploded perspective view of a quartz-crystal device according to a second embodiment.

FIG. 11 is an exploded perspective view of the second embodiment 200 of a quartz-crystal device. The quartz-crystal device 200 is surface-mountable to a printed circuit board or the like. The quartz-crystal device 200 comprises a quartz-crystal frame 210, a package lid 120, and a package base 130.

The quartz-crystal frame 210 comprises a vibrating portion 111, a frame portion 112, and joining portions 117. A through-slot 113 extends, through the thickness dimension (Y'-axis dimension) of the frame 210, along at least three edges of the vibrating portion 111. The vibrating portion 111 includes first and second excitation electrodes 114 connected to respective first and second extraction electrodes 215a, 215b. The extraction electrodes 215a, 215b extend across respective joining portions 117 to respective corners of the frame portion 112. Specifically, the first extraction electrode 215a, connected to the excitation electrode 114 on the −Y'-surface, extends across a respective joining portion 117 to the −X, +Z'-corner of the −Y'-surface of the frame portion 112. The second extraction electrode 215b, connected to the excitation electrode 114 on the +Y'-surface, extends across a respective joining portion 117, then extends in the +X-direction on the fourth region 112d of the frame portion 112, passes from the +Y'-surface to the −Y'-surface at a corner 113c of the through-slot 113, and then extends to the (−X, −Z') corner of the −Y'-surface of the frame portion 112.

This embodiment of a quartz-crystal device 200 is formed by bonding together a three-wafer sandwich in which the quartz-crystal frame 210 is situated between the package lid 120 and the package base 130. This bonding also electrically connects the first extraction electrode 215a and the second extraction electrode 215b automatically to respective electrodes on the package base 130, which involves connecting the excitation electrodes 114 to respective external electrodes 133.

FIG. 12 is a plan view of a quartz-crystal frame 210 of this embodiment. The quartz-crystal frame 210 comprises the vibrating portion 111, the frame portion 112, the joining portions 117, and a through-slot 113 separating three edges of the vibrating portion 111 from the frame portion 112. Respective excitation electrodes 114 are formed on the +Y'-surface of one mesa region 116 and on the −Y'-surface of the other mesa region 116 of the vibrating portion 111. The first extraction electrode 215a, connected to the excitation electrode 114 (not shown) on the −Y'-surface of the vibrating portion 111, extends to the first region 112a of the frame portion 112 via one of the joining portions 117, and continues to the (−X, +Z') corner of the first region 112a. The second extraction electrode 215b, connected to the excitation electrode 114 on the +Y'-surface of the vibrating portion 111, extends to the first region 112a of the frame portion 112 via the other joining portion 117, and continues on the fourth region 112d. The second extraction electrode 215b then passes from the +Y'-surface to the −Y'-surface at the corner 113c of the through-slot 113 (in the region denoted by the dotted line 192), which is at the intersection of the second region 112*b* and the fourth region 112*d*, and finally extends to the (+X, −Z') corner of the frame portion 112.

Figure 12B:
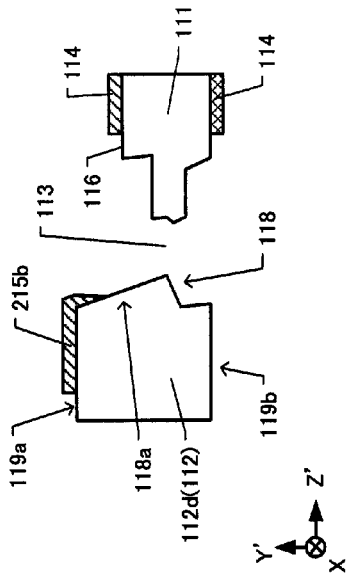
FIG. 12B is a cross-sectional view along the line D-D in FIG. 12A.
Figure 12C:
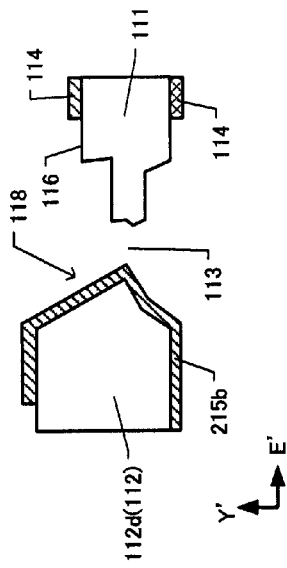
FIG. 12C is a cross-sectional view along the line E-E in FIG. 12A.
Figure 12A:
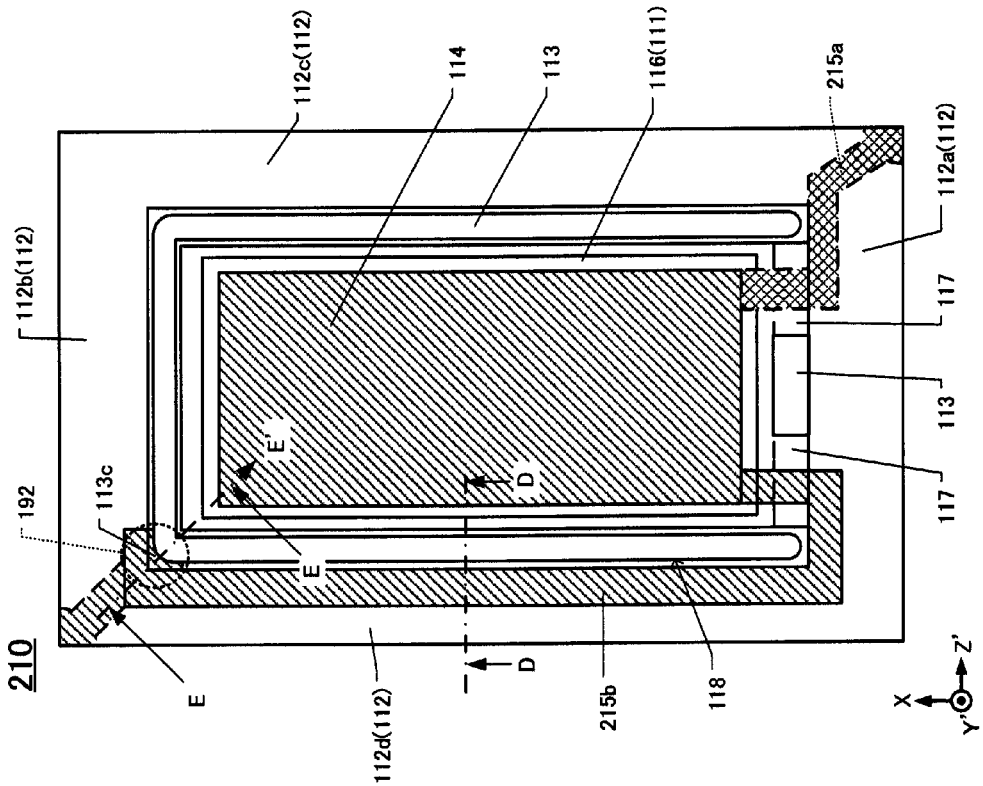
FIG. 12A is a plan view of a quartz-crystal frame of the second embodiment.

FIG. 12B is a cross-sectional view of FIG. 12A taken along the line D-D, showing the second extraction electrode 215*b* as formed on the first plane surface 119*a* on the +Y'-surface of the frame portion 112. Also shown are the first inclined surface 118*a* (a surface connected to the first plane surface 119*a*) of the protrusion 118.

FIG. 12C is a cross-sectional view of FIG. 12A along the line E-E. The second extraction electrode 215*b* is shown as it passes from the +Y'-surface to the −Y'-surface of the frame portion 112 at the corner of the through-slot 113 where the second region 112*b* and fourth region 112*d* intersect. Also, the protrusion 118 exhibits a large projection outward on this corner, which allows a metal film to be formed easily on the edge surface of the frame portion 112. Also, the second extraction electrode 215*b* is formed on the first plane surface 119*a* of the fourth region 112*b* of the frame portion 112, which reduces crystal impedance (CI).

Third Embodiment of Quartz-Crystal Device

According to this embodiment, the joining portions of the quartz-crystal frame are formed in different locations than described in the first and second embodiment. In one configuration according to this third embodiment (FIG. 13A), a first joining portion 317 extends diagonally from the (−X, −Z') corner of the vibrating portion 111 to an adjacent intersection of the first region 112*a* and the fourth region 112*d*, and a second joining portion 317 extends diagonally from the (−X, +Z') corner of the vibrating portion 111 to an adjacent intersection of the second region 112*b* and the third region 112*c*. In another configuration according to this embodiment (FIG. 13B), a first joining portion 417 extends in the −Z'-direction and serves as a bridge for the extraction electrode 415*a* from the excitation electrode 114 to the fourth region 112*d*, and a second joining portion 417 extends in the +Z'-direction and serves as a bridge for the extraction electrode 415*b* from the excitation electrode 114 to the third region 112*c*.

Figure 13A:
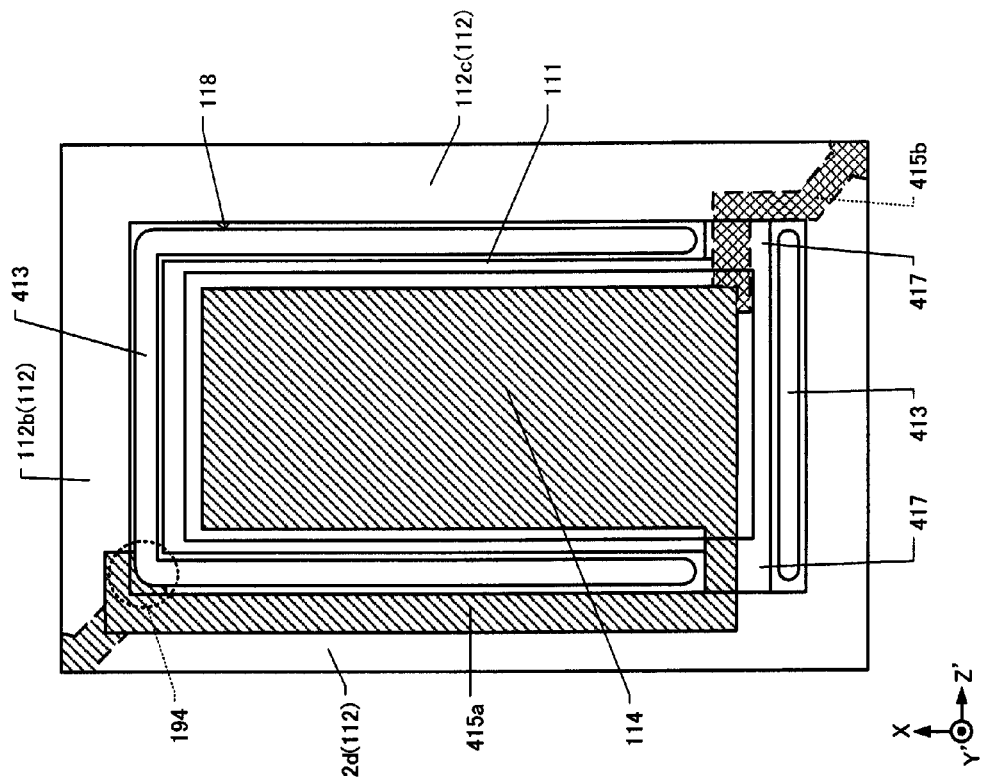
FIG. 13A is a plan view of a quartz-crystal frame according to a third embodiment.

Turning now to FIG. 13A, in the following description thereof, features that are similar to corresponding features in the first embodiment have the same reference numerals. FIG. 13A is a plan view of the quartz-crystal frame 310. The quartz-crystal frame 310 comprises a vibrating portion 111, a frame portion 112, and a pair of joining portions 317 that couple the vibrating portion 111 to the frame portion 112. A respective excitation electrode 114 is situated on a respective mesa 116 on the −Y'-surface and +Y-surface of the vibrating portion 111. A through-slot 313 extends between the vibrating portion 111 and the frame portion 112 around at least three edges of the vibrating portion. An additional through-slot 313 is defined between the vibrating portion 114 and the first region 112*a*. A respective extraction electrode 315*a*, 315*b* is connected to each excitation electrode 114.

More specifically, one joining portion 317 diagonally couples the (−X, −Z') corner of the vibrating portion 114 to the intersection of the first frame region 112*a* and the fourth frame region 112*d*. The extraction electrode 315*a* passes over this joining portion and continues to the (−X, −Z') corner of the quartz-crystal frame 310. The other joining portion 317 diagonally couples the (−X, +Z') corner of the vibrating portion 114 to the intersection of the first frame region 112*a* and the third frame region 112*c*. The second extraction electrode 315*b* passes over this joining portion (dashed-line circle 193) and 317 and continues to the (−X, +Z') corner of the quartz-crystal frame 310.

On the quartz-crystal frame 310, the angle between the joining portion 317 and respective third region 112*c* or fourth region 112*d* of the frame portion 112 is less than 90°. The respective protrusions 118 formed on edge surfaces located between the joining portion 317 and respective frame region 112 are wider (i.e., project outward more) than the respective protrusions 118 formed on edges of the frame region 112. This favors formation of electrodes on the edge surfaces of the frame region. Also, the second extraction electrode 315*b* formed on the second plane surface 119*b* of the third region 112*c* of the frame portion 112 reduces electrical impedance.

Figure 13B:
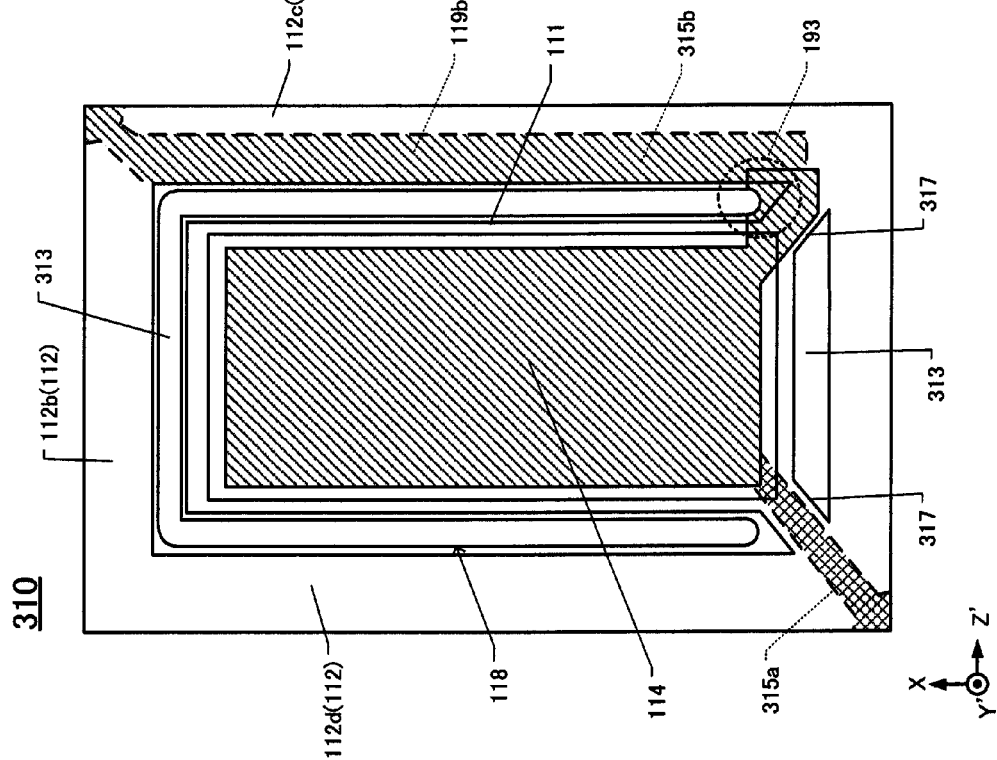
FIG. 13B is a plan view of the quartz-crystal frame according to an alternative configuration of third embodiment.

FIG. 13B is a plan view of the alternative configuration 410 of the quartz-crystal frame. The quartz-crystal frame 410 comprises a vibrating portion 111, a frame portion 112, and a pair of joining portion 417 coupling the vibrating portion 111 to the frame portion 112. A through-slot 413 extends between the vibrating portion 111 and the frame portion 112 around three edges of the vibrating portion 111. A second through-slot 413 extends along the fourth edge of the vibrating portion. A first joining portion 417 couples the (−X, −Z') corner of the vibrating portion to the fourth region 112*d* of the frame portion 112. A second joining portion 417 couples the (−X, +Z') corner of the vibrating portion 111 to the third region 112*c* of the frame portion 112. The vibrating portion 111 has a +Y'-surface and a −Y'-surface each having a mesa configuration. Each of these surfaces of the vibrating portion has a respective excitation electrode 114. A first extraction electrode 415*a* extends from the respective excitation electrode 114 (not shown) on the −Y'-surface of the vibrating portion 111. The extraction electrode 415*a* extends to the third region 112*c* of the frame portion 112 via a respective joining portion 417 and proceeds to the (−X, +Z') corner of the frame portion 112. A second extraction electrode 415*b* extends from the respective excitation electrode 114 on the +Y'-surface of the vibrating portion 111. The extraction electrode 415*b* extends to the fourth region 112*d* of the frame portion 112 via a respective joining portion and proceeds along the fourth region 112*d*. Before reaching the (+X, −Z') corner of the frame portion 112, the extraction electrode 415*b* passes from the +Y'-surface to the −Y'-axis surface at the respective corner of the through-slot 413 (dashed-line circle 194) at which the second region 112*b* and fourth region 112*d* intersect. The extraction electrode then extends, in the thickness dimension, to the −Y'-surface and then to the (+X, −Z') corner.

In the quartz-crystal frame 410, the angle between each joining portion 417 and the third or fourth edge regions 112*c* is a right angle. Consequently, the protrusion 118 projecting between the joining portion 417 and the respective frame portion 112 projects outward farther than the protrusion 418 formed on the edges of the regions of the frame portion 112. This facilitates formation of electrodes on the edge surfaces of the frame portion, specifically on the protrusions 118 formed between the joining portion 417 and the frame portion 112. Also, since the second extraction electrode 415*b* is located on the first plane surface 119*a* of the fourth region 112*d* of the frame portion 112, electric impedance is favorably reduced.

INDUSTRIAL APPLICABILITY

Representative embodiments have been described in detail above. As evident to those skilled in the art, the present invention may be changed or modified in various ways within the technical scope of the invention.

For example, in the described embodiment of a method for manufacturing the vibrating portion, although the vibrating portion and the through-slot are formed using a positive photoresist, a negative photoresist alternatively can be used. Since a negative photoresist degrades when exposed, regions thereof destined to be etched should be covered with the exposure mask during etching.

What is claimed is:

1. A quartz-crystal device, comprising:
an AT-cut quartz-crystal frame including a rectangular quartz-crystal vibrating portion, a rectangular frame portion surrounding the vibrating portion, and at least one joining portion, the vibrating portion having first, second, third, and fourth edges and first and second principal surfaces, the principal surfaces each including a respective excitation electrode, the frame portion comprising first, second, third, and fourth frame regions that are coupled together to form the rectangular frame, wherein the first frame region is a short side of the frame portion coupled at a right angle to the third frame region, the third frame region is a long side of the frame portion coupled at a right angle to the second frame region, the second frame region is a short side of the frame portion coupled at a right angle to the fourth frame region, and the fourth frame region is a long side of the frame portion coupled at a right angle to the first frame region, such that the first, second, third, and fourth frame regions are adjacent respective edges of the rectangular frame portion, the at least one joining portion coupling the vibrating portion to the frame portion at or near the first frame region;
a package base bonded to the frame portion, the package base including first and second external electrodes situated at respective sites on an external principal surface of the package base, the first and second external electrodes being electrically connected via respective extraction electrodes to respective excitation electrodes on the vibrating portion;
wherein the third frame region near its coupling with the first frame region includes a depth dimension and first and second plane surfaces that are parallel to respective principal surfaces of the vibrating portion, the third frame region also having an edge surface extending into the depth dimension and facing a corresponding edge surface of the vibrating portion, the edge surface of the third frame region including one or both of first and second sloped surfaces extending into the depth dimension from the first plane surface and second plane surface, respectively, to form a protrusion that projects toward the corresponding edge surface of the vibrating portion; and
wherein the frame portion comprises a first extraction electrode extending via an joining portion from a respective excitation electrode to a respective external electrode, and further comprises a second extraction electrode extending from a respective excitation electrode to a respective external electrode via a joining portion, the first plane surface of the third frame region and the protrusion, or the second plane surface of the third frame region and the protrusion.

2. The quartz-crystal device of claim 1, wherein:
the AT-cut quartz-crystal frame includes a thickness dimension; and
the AT-cut quartz-crystal frame defines a through-slot extending through the thickness dimension along at least three edges of the vibrating portion between the vibrating portion and corresponding regions of the frame portion; and
the second extraction electrode extends from the first principal surface to the second principal surface, or from the second principal surface to the first principal surface via the through-slot.

3. The quartz-crystal device of claim 2, wherein:
the through-slot includes a corner thereof, having an angle less than 90°, formed at a conjunction of two joining portions, the first frame region, the second frame region, and the third frame region; and
a portion of the through-slot through which the second extraction electrode passes includes the corner.

4. The quartz-crystal device of claim 3, wherein:
a longitudinal direction of the AT-cut quartz-crystal frame is denoted an X-axis, a thickness direction is denoted a Y'-axis direction, and a short direction is denoted a Z'-axis direction;
the frame portion is formed by wet-etching;
the first frame region and second frame region extend in the Z'-axis direction; and
the third frame region extends in the X-axis direction.

5. The quartz-crystal device of claim 2, wherein:
a longitudinal direction of the AT-cut quartz-crystal frame is denoted an X-axis, a thickness direction is denoted a Y'-axis direction, and a short direction is denoted a Z'-axis direction;
the frame portion is formed by wet-etching;
the first frame region and second frame region extend in the Z'-axis direction; and
the third frame region extends in the X-axis direction.

6. The quartz-crystal device of claim 1, wherein:
a longitudinal direction of the AT-cut quartz-crystal frame is denoted an X-axis, a thickness direction is denoted a Y'-axis direction, and a short direction is denoted a Z'-axis direction;
the frame portion is formed by wet-etching;
the first frame region and second frame region extend in the Z'-axis direction; and
the third frame region extends in the X-axis direction.

7. The quartz-crystal device of claim 1, further comprising first and second electrically conductive pads formed on a surface of the package base facing the frame portion, the first pad being electrically connected to the first extraction electrode and first external electrode, and the second pad being electrically connected to the second extraction electrode and second external electrode, wherein the package base and the rectangular frame are bonded together using a sealing material.

* * * * *